US005623143A

United States Patent [19]
Takamatsu

[11] Patent Number: 5,623,143
[45] Date of Patent: Apr. 22, 1997

[54] PHOTO SENSOR HAVING SECTIONED LENS

[75] Inventor: Hiroyuki Takamatsu, Kanagawa, Japan

[73] Assignee: Sony Corporation, Japan

[21] Appl. No.: 468,319

[22] Filed: Jun. 6, 1995

[30] Foreign Application Priority Data

Jun. 14, 1994 [JP] Japan .................................. 6-156673

[51] Int. Cl.$^6$ ..................................................... H01J 5/02
[52] U.S. Cl. ........................................ 250/239; 250/214.1
[58] Field of Search .................................... 250/239, 216, 250/214.1, 221; 359/708, 718, 719, 720; 340/825.69; 341/176

[56] References Cited

U.S. PATENT DOCUMENTS 4,024,397  5/1977  Weiner ..................... 250/216
4,657,352  4/1987  Suda et al. ............... 359/719
4,864,137  9/1989  Klein ....................... 359/708

Primary Examiner—Que Le
Attorney, Agent, or Firm—Ronald P. Kananen

[57] ABSTRACT

The photo sensor of the present invention is comprised of a photo sensing element for receiving a predetermined light and converting it into an electrical signal; a package for sealing the photo sensing element; and a lens arranged at the front surface of the package so as to collect light within a predetermined range in vertical and lateral directions to the photo sensing element, wherein a shape of the lens is set such that a curvature of the upper segment in the vertical direction is larger as compared with that of the lower segment, and only the requisite signal can be received without being influenced by the disturbance light or the like so as to prevent any erroneous operation.

13 Claims, 4 Drawing Sheets

PHOTO SENSOR HAVING SECTIONED LENS

BACKGROUND OF THE INVENTION

1. Field of the Invention

This invention relates to a photo sensor in which light within a predetermined range is collected by a lens arranged within a package, and the collected light is received by a photo sensing element within the package and converted into an electrical signal.

2. Description of Prior Art

A remote control function to enable a user to perform a desired operation at a remote location is frequently used in electrical equipment such as a television set or a video tape recorder and the like.

In order to perform a remote controlling operation for electrical equipment such as a television set, a photo sensor for sensing an infrared ray beam is arranged at the electrical equipment and a commander for transmitting a signal comprised of an infrared ray beam is prepared for the user.

The user selects an input button or the like set in the commander so as to further select a desired operation and then transmits the infrared ray signal from the commander in response to the desired operation.

At the electrical equipment, the infrared ray signal transmitted from the commander is received at the photo sensor installed in the electrical equipment and converted into a predetermined electrical signal, then the electrical equipment may perform an operation requested by the user in response to this electrical signal.

FIGS. 1A and 1B illustrate the related photo sensor. FIG. 1A is a perspective view and FIG. 1B illustrates a side elevational view in section, respectively.

This photo sensor 1 is comprised of a photo sensing element 10 for receiving an infrared ray beam, for example, and converting it into a predetermined electrical signal; a package 2 made of resin, for example, to make an integral sealing of the photo sensing element 10; electrical lead terminals 3 electrically connected to the photo sensing element 10 within the package 2 and extending downward from the package 2; and a lens 4 arranged at the front surface of the package 2 for collecting the light within the predetermined range toward the photo sensing element 10.

The lens 4 arranged in the package 2 is integrally molded with the package 2, for example, and the lens has a spherical surface in which the distances $r_1$, $r_2$ and $r_3$ measured from the center O of the lens are equal from each other.

With such an arrangement as above, the light within a range of angles of upper angle α and lower angle α in respect to a horizontal line, for example, is collected so as to enable the photo sensing element 10 to perform a desired photo-electrical conversion.

Further, since the lens 4 has a spherical surface, it collects light directed not only in the vertical direction but also in the lateral one, then the light collecting range obtained with this lens 4 becomes a sensitivity range attained by a single unit of the photo sensor 1.

FIG. 2 is a schematic diagram for illustrating a state of use of the photo sensor 1.

It is usually found that electrical equipment 11 such as television set or a video tape recorder or the like is installed at a wall side of an indoor area 5.

The photo sensor 1 is set at the front surface of a panel of the electrical equipment 11 to facilitate a receiving of the infrared ray signal.

Under such an arrangement state as above, a user 6 may select a desired operation through the commander 7 at the side of the user and transmit a signal comprising of an infrared ray beam to the photo sensor 1 of the electrical equipment 11.

When the user 6 operates the commander 7 under a condition in which the user 6 stands up, for example, the signal is transmitted from a position slightly higher than the position of the photo sensor 1 (refer to the arrow ① in FIG. 2).

In addition, when the user 6 operates the commander 7 while the user 6 sits on the floor or something, a signal is transmitted from a position slightly lower than the position of the photo sensor 1 (refer to the arrow ② in FIG. 2).

A sensitivity range corresponding to the state of use is set at the photo sensor 1 in order to perform a positive receiving of a signal sent from the commander 7.

That is, in the case that a wide sensitivity range is to be attained, a curvature of the lens 4 shown in FIG. 1 is reduced and in turn in the case that a directivity is increased within a narrow sensitivity range, a curvature of the lens 4 is increased.

In addition, in the case that it is desired to reduce the curvature of the lens 4, its sensitivity range is widened, although a rate of collecting light is reduced and a reaching distance of the signal from the commander 7 is made short.

Further, in the case that a curvature of the lens 4 is increased, the sensitivity range is increased, although a rate of collecting light is increased and a reaching distance of the signal from the commander 7 is made long.

In the design of the photo sensor 1, a curvature of the lens 4 corresponding to the state of use is determined in view of this point.

However, such a photo sensor as described above has the following problems.

That is, as shown in FIG. 2, various kinds of lighting devices 8 are normally installed at the indoor area 5 in which the electrical equipment 11 is arranged and some disturbance lights such as infrared ray beams or electro-magnetic wave for use in controlling lighting obtained from the lighting devices 8 are discharged in the room.

As the disturbance lights reach the photo sensor 1 installed in the electrical equipment 11 as shown by the arrow ③ in FIG. 2, they may disturb the photo-electrical conversion performed by the photo sensing element 30 (refer to FIGS. 3A and 3B) and they may become causes to generate erroneous operation.

In the case that a solar light other than the disturbance light projected from the lighting devices 8, for example, enters at a window of a room, this light may similarly cause a similar erroneous operation.

Normally, the disturbance light enters from a position substantially higher than the position of the photo sensor 1, resulting in that it may be assumed that the curvature of the lens 4 is increased so as to improve a directivity and the disturbance light entering from the high position is set out of the sensitivity range. However, the sensitivity range for receiving the requisite signal from the commander 7 is also narrowed and it becomes difficult to get a sufficient remote control function.

SUMMARY OF THE INVENTION

A first object of the present invention is to provide a photo sensor in which noises such as disturbance light are reduced.

A second object of the present invention is to provide a package having a lens in which a directivity is set in the lens arranged at the front surface of the photo sensing element and erroneous operation caused by disturbance light or the like is prevented.

In the photo sensor of the present invention, the curvature of the lens at its upper half part is higher than as compared with that of the lens at its lower half part, so that the directivity of the upper half part of the lens is higher than that of the lower half part of the lens.

That is, the sensitivity range of the signal at the upper half part of the lens is narrow and its directivity is increased and the reaching distance of the requisite signal can be extended without being influenced by the disturbance light entering from the substantial higher position than that of the photo sensor.

In addition, much amount of infrared ray beams are contained in the disturbance light obtained from the lighting equipment or solar beam, so that it could be possible to get a sufficient amount of requisite infrared ray beams without receiving any disturbance light and to restrict occurrence of erroneous operation caused by the disturbance light if the lens having different curvatures at its upper and lower segments is applied in the photo sensing element for receiving the infrared ray beams.

BRIEF DESCRIPTION OF THE DRAWINGS

FIG. 1A is a perspective view and FIG. 1B is a side elevational view in section.

FIG. 3A is a perspective view and FIG. 3B is a sectional view in section taken along an arrow line A—A of FIG. 3A.

FIG. 4A is a front elevational view and FIG. 4B is a side elevational view in section.

DETAILED DESCRIPTION OF THE PREFERRED EMBODIMENTS

Figure 1A:
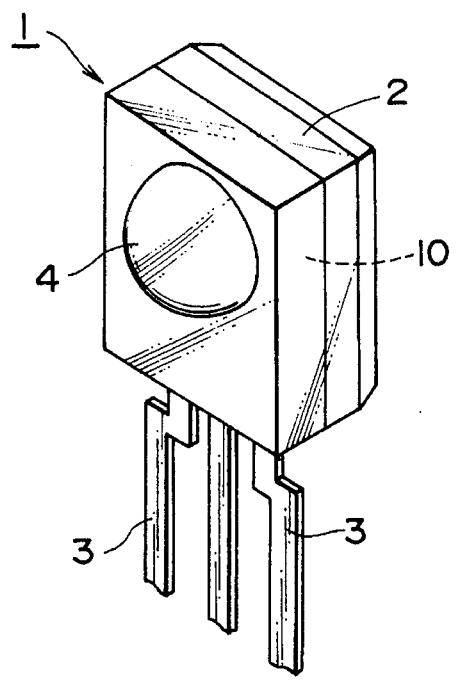
FIGS. 1A and 1B are views for illustrating an example of the related photo sensor.
Figure 1B:
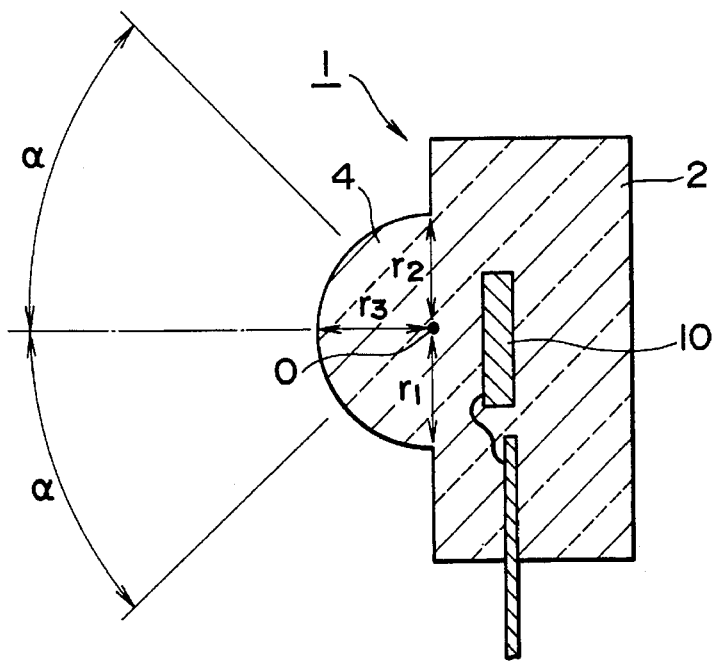

Referring now to the drawings, some preferred embodiments of the present invention will be described as follows.

Figure 3A:
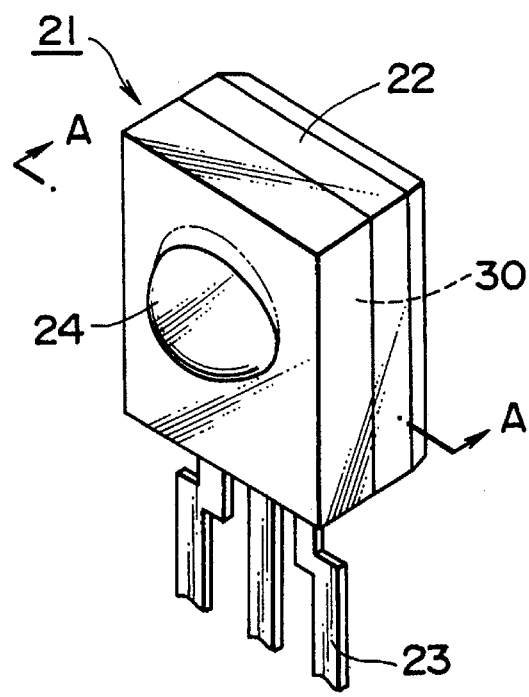
FIGS. 3A and 3B are views for illustrating the photo sensor of a first preferred embodiment of the present invention.
Figure 3B:
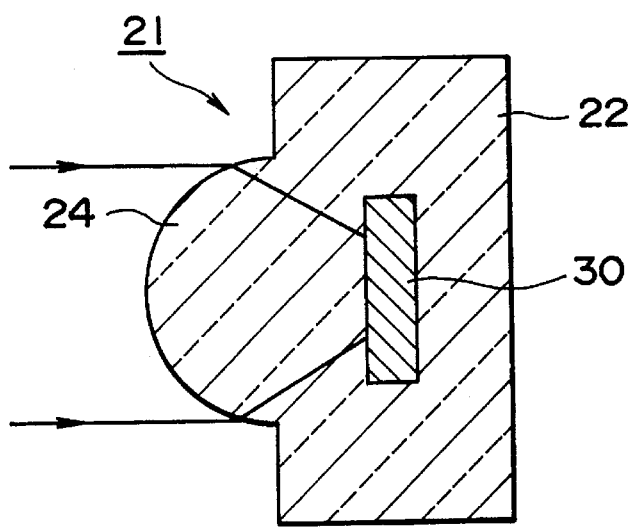

FIGS. 3A and 3B are views for illustrating the photo sensor of a first preferred embodiment of the present invention. FIG. 3A is a perspective view and FIG. 3B is a sectional view in section taken along an arrow line A—A of FIG. 3A.

Figure 4A:
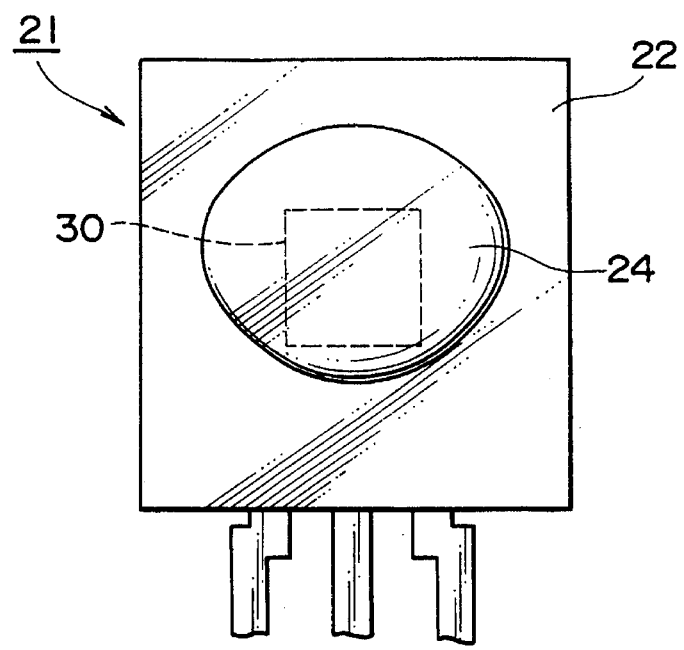
FIGS. 4A and 4B show the photo sensor of the present invention.
Figure 4B:
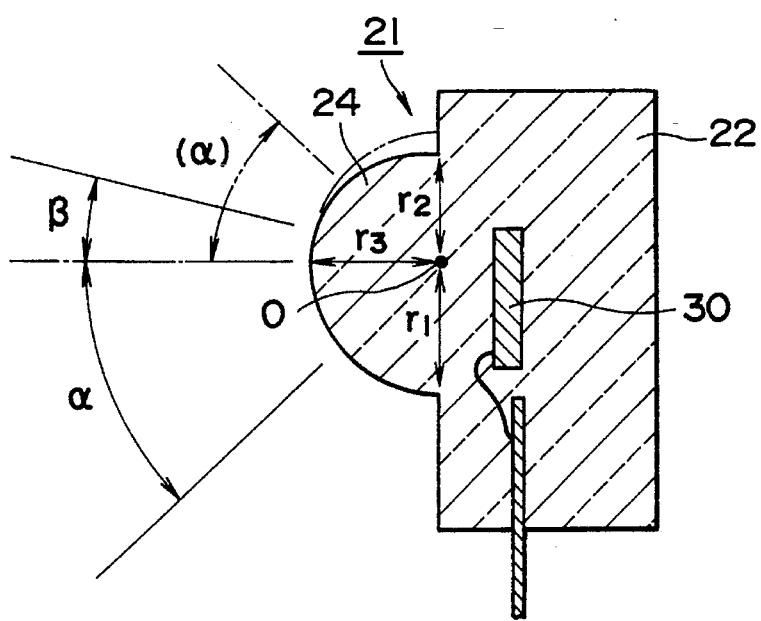

FIG. 4 shows the photo sensor of the present invention, wherein FIG. 4A is a front elevational view and FIG. 4B is a side elevational view in section.

That is, the photo sensor 21 of the present invention is comprised of a photo sensing element 30 composed of a photo-diode or the like for receiving an infrared ray beam, for example, and converting it into a predetermined electrical signal; a package 22 made of resin for sealing this photo sensing element 30; lead terminals 23 electrically connected to the photo sensor 30 within the package 22 and extending downward from the package 22; and a lens 24 integrally formed at the front surface of the package 22 so as to collect light within predetermined ranges in vertical and lateral directions.

Figure 2:
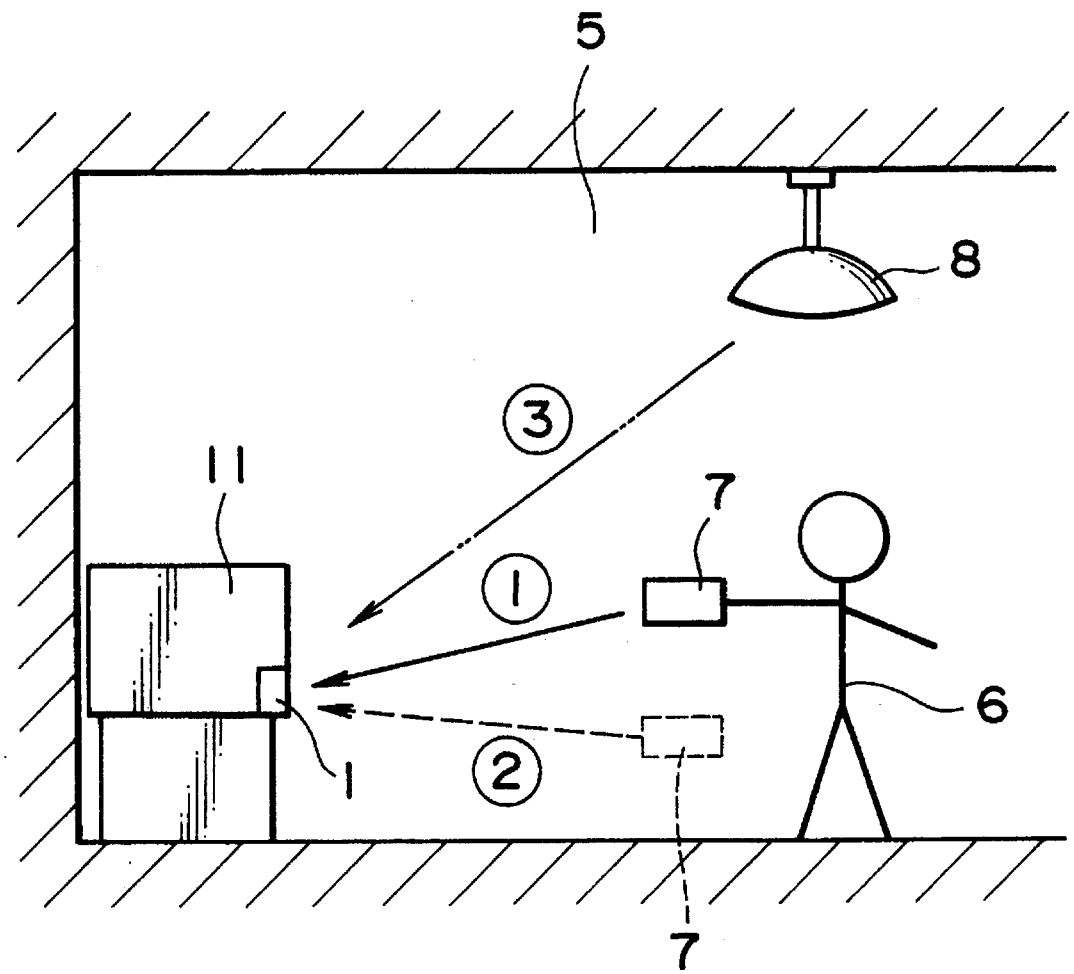
FIG. 2 is a schematic diagram for illustrating a state of use of the photo sensor.

The photo sensor 21 is arranged at the front surface of the panel of the electrical equipment 11 shown in FIG. 2 and performs a processing for receiving a signal comprised of infrared ray light from the commander 7 operated by the user 6 and converting this signal into a predetermined electrical signal. The center of said photo sensing element 30 is set at a lower position than the center point of the lens 24.

The lens 24 of the photo sensor 21 of the present invention is set such that the curvature at the upper half segment of the lens 24 in its vertical direction is larger than that of the lower half segment so as not to receive the disturbance light of the lighting equipment or the like entering from a substantial higher location than that of the photo sensor 21.

That is, a higher setting of the curvature of the upper half segment of the lens 24 causes a sensitivity range of the signal at the upper half segment of the lens 24 to be narrowed and increases its directivity.

For example, as shown in FIG. 4B, the lens 24 is formed into an elliptic spherical surface shape with the distance $r_1$ from the center O of the lens 24 being 2.3 mm, the distance $r_2$ being 2.2 mm and the distance $r_3$ being 2.3 mm and the curvature at the upper half segment of the lens 24 is made large as compared with that of the lower half segment.

With such an arrangement as above, it is possible to set a light collecting angle $\alpha$ at the lower half segment of the lens 24 in respect to the horizontal line and further to set the light collecting angle $\beta$ at the upper half segment of the lens which is smaller than $\alpha$.

A double dot and dash line in FIG. 4B shows an outer shape of the upper half segment of the lens and the light collecting angle in the case that the curvatures of the lens 24 in the vertical direction are equal to each other.

The light collecting angle at the upper half segment of the lens 24 becomes $\beta$ to cause the sensitivity range of the signal to be narrowed and concurrently its directivity is also increased to cause a reaching distance of the signal from the commander 7 shown in FIG. 2 to be extended.

In other words, the photo sensor 21 does not receive the disturbance light which is out of the light collecting angle $\beta$ of the lens 24 and can positively receive the requisite signal from the commander 7.

A curvature of the lens 24 is set such that a curvature of the upper half segment of the lens is increased by about 1 to 20%, for example, as compared with that of the lower half segment in response to the state of use.

That is, as a curvature of the upper half segment of the lens 24, a value showing a light collecting angle $\beta$ is selected in which a signal of the commander 7 can reach while the user 6 shown in FIG. 2 stands up and the disturbance light projected from the lighting equipment 8 located at a substantial higher position than that of the photo sensor 21 is not received.

With such an arrangement as above, the disturbance light obtained from the lighting equipment 8 is out of the light collecting range $\beta$ of the lens 24 and does not provide any influence over a photo-electrical conversion of the photo sensing element 30.

That is, the photo sensing element 30 can perform a photo-electrical conversion positively on the basis of only a signal obtained from the commander 7.

In addition, the curvature of the lower half segment of the lens 24 is smaller than that of the upper half segment and its light collecting angle is $\alpha$ which is wider than $\beta$.

Due to this fact, even if the user 6 shown in FIG. 2 operates the commander 7 while the user 6 sits, it is possible to perform a sufficient transmittance of the signal to the photo sensing element 30 through the lens 24.

With such an arrangement as above, it becomes possible to execute the operation specified from the commander 7 without having any erroneous operation at the electrical equipment 11.

The larger value of the curvature at the upper half segment of the lens 24 than that of the lower half segment means that the light collecting rate is higher at the upper half segment, and the lower half segment shows a wide sensitivity range.

Normally, in the case that a remote controlling operation is to be carried out so as to operate the commander 7 from the location relatively spaced apart from the position of the electrical equipment 11 shown in FIG. 2, the signal is transmitted from the angle slightly higher than the horizontal line as shown by an arrow ① in FIG. 2.

Additionally, in the case that the commander 7 is to be operated from the location which is relatively near the position of the electrical equipment 11, the signal is transmitted from the position lower than the horizontal line at a wider angle.

In the case of the photo sensor 21 of the present invention, since the light collecting rate at the upper half segment of the lens 24 is kept high, so that it becomes possible to get a long signal reaching distance at such an angle as one indicated by the arrow ① in FIG. 2 and then a sufficient accommodation for the operation of the commander 7 at the location relatively spaced apart from the electrical equipment 11 can be attained.

In addition, since the sensitivity range at the lower half segment of the lens 24 is wide, the present invention can accommodate for the operation of the commander 7 at the location which is relatively near the electrical equipment 11.

That is, the photo sensor 21 can hold the sensitivity range corresponding to the signal transmitting state obtained from the commander 7 described above, resulting in that a positive remote control can be performed.

In the preferred embodiment of the present invention, although the case in which the lens 24 is formed of an elliptic spherical surface has been described, the present invention is not limited to this arrangement and the present invention can be similarly applied to an arrangement of the lens 24 having a spherical surface in which the curvature of the upper half segment is higher as compared with that of the lower half segment.

In addition, as the disturbance light, one generated from the lighting equipment shown in FIG. 2 has been described as one example and the present invention can be similarly applied to another case in which the solar beam is incident at a window or the like.

Since these light beams contain a large amount of infrared ray beams, application of the lens 24 as described above enables a positive photo-electrical conversion processing to be carried out without being badly influenced by the disturbance light in the case that the infrared ray beams are received as the photo sensing element 30 at the photo sensor 21 of the present invention.

As described above, the photo sensor of the present invention has the following effects.

That is, the curvature at the upper half segment of the lens in the photo sensor of the present invention is set to be larger than that of the lower half segment, resulting in that only the sensitivity range of the upper half segment is narrowed and it becomes possible to perform a positive receiving of only the requisite signal without receiving any disturbance light entering at the relative high position.

With such an arrangement as above, erroneous operation in the photo-electrical conversion in the photo sensing element is reduced and it becomes possible to provide a photo sensor having a high reliability in operation.

The present invention is effective in the case that it is applied in the photo sensing element for receiving the infrared ray beams contained much in the disturbance light, in particular.

What is claimed is:

1. A photo sensor comprising:

a photo sensing element for receiving a predetermined light and converting the light into an electrical signal;

a package for sealing said photo sensing element; and a lens arranged at a front surface of said package for collecting light within a predetermined wavelength range to said photo sensing element;

wherein a shape of said lens has its curvature changed only in a predetermined direction;

wherein said predetermined direction is a vertical direction, which corresponds to a y-axis of an x-y axis array with an origin at a center point of said lens;

wherein said lens is divided into an upper segment and a lower segment; and wherein said shape of said lens is set to have a curvature at the upper segment in said vertical direction which is larger than that of the lower segment.

2. A photo sensor comprising:

a photo sensing element for receiving a predetermined light and converting the light into an electrical signal;

a package for sealing said photo sensing element; and a lens arranged at a front surface of said package for collecting light within a predetermined wavelength range to said photo sensing element;

wherein a shape of said lens has its curvature changed only in a predetermined direction;

wherein said predetermined direction is a vertical direction, which corresponds to a y-axis of an x-y axis array with an origin at a center point of said lens;

wherein said lens is divided into an upper segment and a lower segment; and wherein a curvature of the upper segment of said lens is larger than by 1% to 20% as compared with that of the lower segment.

3. A photo sensor comprising:

a photo sensing element for receiving a predetermined light and converting the light into an electrical signal;

a package for sealing said photo sensing element; and a lens arranged at a front surface of said package for collecting light within a predetermined wavelength range to said photo sensing element;

wherein a shape of said lens is of an elliptically spherical surface;

wherein an x-y axis is defined with its origin at a center point of said lens; and wherein a curvature of said lens is 2.3 mm at the front surface of the package along said x-axis as well as its lower side along said y-axis below said origin and 2.2 mm at the upper side thereof along said y-axis above said origin.

4. A photo sensor according to claim 3, wherein said package and said lens are integrally formed.

5. A photo sensor according to claim 3, wherein light received at said photo sensing element is of infrared ray beams.

6. A photo sensor according to claim 3, wherein the center of said photo sensing element is set at a lower position than the center point of said lens.

7. A photo sensor comprising:
- a lens arranged for collecting light within a predetermined wavelength range; and
- a photo sensing element for receiving said light from said lens and converting the light into an electrical signal;
- wherein said lens has an upper half section and a lower half section; and
- wherein said upper half section has a greater curvature than said lower half section.

8. A photo sensor as in claim 7, wherein said upper half section has a first light collecting angle and said lower half section has a second light collecting angle.

9. A photo sensor as in claim 8, wherein said second light collecting angle is wider than said first light collecting angle.

10. A photo sensor as in claim 7, wherein a shape of said lens is that of an elliptically spherical surface.

11. A photo sensor as in claim 7, wherein the curvature of said upper half section is greater by 1% to 20% as compared with the curvature of said lower half section.

12. A photo sensor as in claim 7, wherein light received at said photo sensing element is of infrared ray beams.

13. A photo sensor as in claim 7, wherein the center of said photo sensing element is set at a lower position than the center point of said lens.

* * * * *